(12) United States Patent
Satake et al.

(10) Patent No.: US 6,198,254 B1
(45) Date of Patent: Mar. 6, 2001

(54) BATTERY CAPACITY MEASUREMENT APPARATUS, TAKING INTO CONSIDERATION A GASSING VOLTAGE THAT CHANGES RELATIVE TO TEMPERATURE

(75) Inventors: Syuji Satake; Michito Enomoto, both of Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/609,164

(22) Filed: Jul. 3, 2000

(30) Foreign Application Priority Data

Jul. 2, 1999 (JP) .................................................. 11-189379

(51) Int. Cl.[7] .............................. H02J 7/00; H02M 2/00; G01N 27/416
(52) U.S. Cl. ......................... 320/132; 320/134; 320/136; 429/61; 324/427; 324/433
(58) Field of Search .................................. 320/132, 134, 320/136; 429/61; 324/427, 433

(56) References Cited

U.S. PATENT DOCUMENTS

| | | | |
|---|---|---|---|
| 3,848,181 | * 11/1974 | Herbert, Jr. et al. | 324/429 |
| 5,321,627 | * 6/1994 | Reher | 702/63 |
| 5,432,429 | * 7/1995 | Armstrong, II et al. | 320/136 |
| 5,751,134 | * 5/1998 | Hoerner et al. | 320/124 |
| 6,045,941 | * 4/2000 | Milewits | 429/91 |
| 6,060,185 | * 5/2000 | Okutoh | 429/7 |

FOREIGN PATENT DOCUMENTS

| | | |
|---|---|---|
| 7-278351 | 10/1995 | (JP) . |
| 8-278352 | 10/1996 | (JP) . |

* cited by examiner

Primary Examiner—Peter S. Wong
Assistant Examiner—Gregory J. Toatley, Jr.
(74) Attorney, Agent, or Firm—Finnegan, Henderson, Farabow, Garrett & Dunner, L.L.P.

(57) ABSTRACT

The temperature of a battery is detected by a temperature sensor, and a gassing voltage based on the temperature is determined by a gassing detection processing section at all times, and even during traveling, a full charge capacity calculation processing section estimates a full charge capacity on the axis of the full charge capacity from when the gassing occurred, from the remaining capacity at the time of gassing and a chargeable capacity.

5 Claims, 7 Drawing Sheets

BATTERY CAPACITY MEASUREMENT APPARATUS, TAKING INTO CONSIDERATION A GASSING VOLTAGE THAT CHANGES RELATIVE TO TEMPERATURE

BACKGROUND OF THE INVENTION

1. Field of the Invention

The present invention relates to a battery capacity measurement apparatus, and in particular, to a battery capacity measurement apparatus, taking a gassing voltage into consideration, wherein a full charge capacity during traveling is estimated from a gassing voltage that changes relative to temperature.

2. Description of the Related Art

Electric vehicles use a battery for traveling, hence it is important to accurately estimate the remaining capacity.

Figure 1:
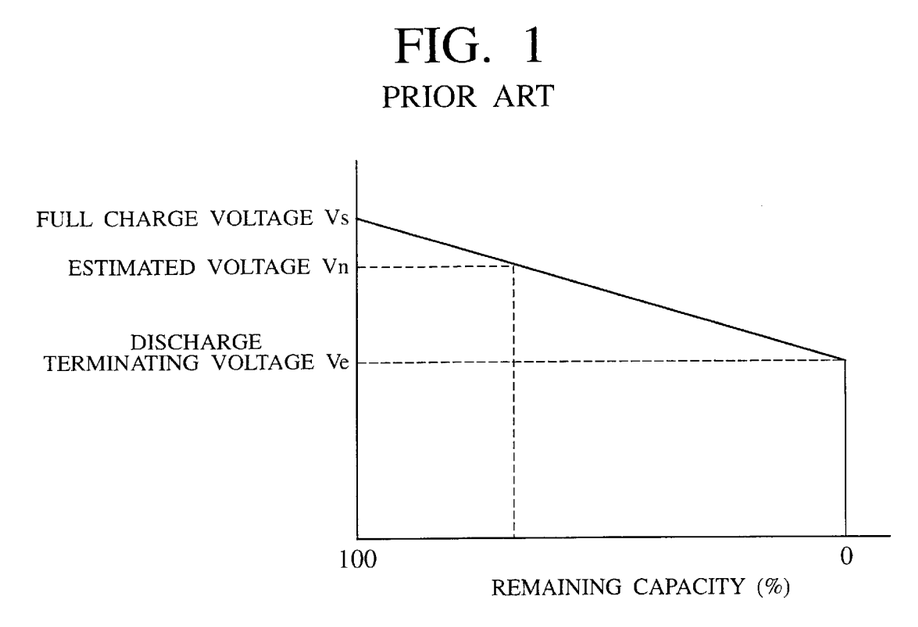
FIG. 1 is a schematic diagram for explaining a conventional calculation method of a remaining capacity.

For example, in a battery remaining capacity apparatus disclosed in Japanese Patent Application Laid-Open (JP-A) No. 7-278351, a battery controller determines the remaining capacity SOC (also referred to as "dischargeable capacity") of a battery immediately after turning on the ignition from a following expression (1), as shown in FIG. 1, in view of an easy calculation, and displays this:

$$SOC=[(V_n^2-V_e^2)]/(V_s^2-V_e^2)]\times 100\% \qquad (1)$$

wherein

Vn: estimated voltage of a battery

Ve: discharge terminating voltage

Vs: full charge voltage.

The full charge voltage Vs is a voltage related to a new one in which a battery does not deteriorate, and is a voltage when the battery is charged at a temperature of 20° C. so as to be fully charged up to 100%.

Calculation of the aforesaid remaining capacity SOC is performed as described below.

The discharge current from the battery and the terminal voltage are collected in a predetermined number to be averaged on a voltage-current coordinate, and when the predetermined number of the averaged data are collected, a correlation coefficient r of the data is determined.

Next, when the correlation coefficient r shows a strong negative correlation, a regression line (also referred to as "approximation line") of the data is determined from the method of least squares. From the approximation line Y (Y=a·X+b) and a reference current Io, the estimated voltage Vn of the battery at present is estimated.

Then, using the estimated voltage Vn, the present remaining capacity SOC during traveling is determined from the full charge voltage Vs corresponding to the remaining capacity 100% and the discharge terminating voltage Ve corresponding to the remaining capacity 0%, according to the above-described expression (1), and displayed.

Moreover, in hybrid vehicles comprising an engine and a motor, and driven by either of these, a battery controller has recently been used. During traveling, if the remaining capacity decreases, regenerative electric power from an alternator of the hybrid mechanism (a mechanism having a plurality of power sources comprising an alternator, an engine and the like) is charged to the battery. The remaining capacity during traveling is controlled to 60% to 80% so that the battery controller used in such a hybrid vehicle can charge the regenerative electric power at all times during traveling.

However, in general, batteries have such characteristics that the capacity decreases at low temperature compared to that of at the time of high temperature, and at the time of low temperature, even if the battery is fully charged, the capacity does not reach 100%, and for example, the capacity is 80%.

Moreover, there is a case where even if the battery is fully charged, the capacity does not show 100% due to deterioration of the battery, and the capacity shows, for example, 80%.

That is to say, if a temperature drops, or the battery is deteriorated, the remaining capacity does not show 100%, even if the battery is fully charged, hence overcharge occurs.

At the time of high temperature, on the contrary, the voltage of the battery tends to be high, causing insufficient charge.

That is to say, there is a problem in that it cannot be accurately judged, from the remaining capacity of the battery, how much it is chargeable during traveling.

In particular, with a method of determining the remaining capacity from the above-described expression (1), the remaining capacity actually shows 100%, only when the battery is fully charged at a reference temperature (20° C.), in a non-traveling condition.

Accordingly, to prevent an error from arising during traveling, because of the capacity change of the battery due to the temperature, there is a method in which the full charge capacity in the non-traveling condition is made 100%.

However, even if it is attempted to apply this method to a hybrid vehicle in which regenerative electric power of the alternator is charged to thereby keep the remaining capacity (dischargeable capacity) constant during traveling, the temperature changes even at the time of traveling. Therefore, if the method using the expression (1) is applied to the hybrid vehicle, the determined remaining capacity is not a reliable charge capacity, causing a problem in that overcharge or insufficient charge occurs.

On the other hand, batteries reach a gassing voltage (a voltage at which generation of gasses becomes active), when the charge capacity exceeds 90%.

With the conventional remaining capacity measurement apparatus of a battery, however, there is a problem in that calculation of the remaining capacity and charge are not performed, taking the effects of gassing into consideration.

SUMMARY OF THE INVENTION

The present invention has been achieved to solve the above-described problems, and it is an object of the present invention to obtain a battery capacity measurement apparatus, taking into consideration a gassing voltage that changes relative to temperature, which can accurately determine a full charge capacity during traveling, taking a gassing voltage and temperature into consideration.

To achieve the above-described object, there is provided a battery capacity measurement apparatus which charges a battery with power produced by the operation of a load in a constant current, when the remaining capacity of the battery decreases due to the operation of the load, to thereby keep a set full charge capacity during the load operation, and collects the voltages and currents of the battery to determine the remaining capacity of the battery from these voltages and currents, comprising: a temperature sensor for detecting the temperature in the vicinity of the battery; a gassing detection processing section which determines a gassing voltage of the battery, based on the temperature detected by the temperature sensor, every time the voltages and currents are collected, and detects that the battery is in a gassing condition, when the collected voltage is or exceeds the gassing voltage; a charge current changeover instruction processing section for instructing a changeover of the constant current value at the time of charging the battery to a smaller value, upon detection of the gassing condition; and a full charge capacity calculation processing section which reads the remaining capacity every time the gassing condition is detected, and determines the full charge capacity at the time when the load changes, from the remaining capacity at the time of gassing, a chargeable capacity set in advance, and a full charge capacity at the time of a reference temperature and no load, to thereby set the full charge capacity.

According to a preferred aspect of the present invention, the charge current changeover instruction processing section instructs a stepwise changeover of the constant current value at the time of charging the battery to a smaller value, every time the gassing condition is detected.

According to a preferred aspect of the present invention, the battery capacity measurement apparatus further comprises: a full charge voltage correction processing section which corrects the full charge voltage based on the ratio of the set full charge capacity to the full charge capacity at the time of a reference temperature and no load, every time the full charge capacity is set, and measures the remaining capacity based on the corrected full charge voltage.

According to a preferred aspect of the present invention, the full charge capacity calculation processing section determines the full charge capacity at the time when the load changes on an axis of the full charge capacity.

According to a preferred aspect of the present invention, the load comprises: an alternator; and a converter which converts the discharge power from the battery to a predetermined current with respect to the alternator, and converts regenerative electric power from the alternator into charge current of a constant current having a value determined by the charge current changeover instruction processing section.

The nature, principle and utility of the invention will become more apparent from the following detailed description when read in conjunction with the accompanying drawings.

DESCRIPTION OF THE PREFERRED EMBODIMENTS

Figure 2:
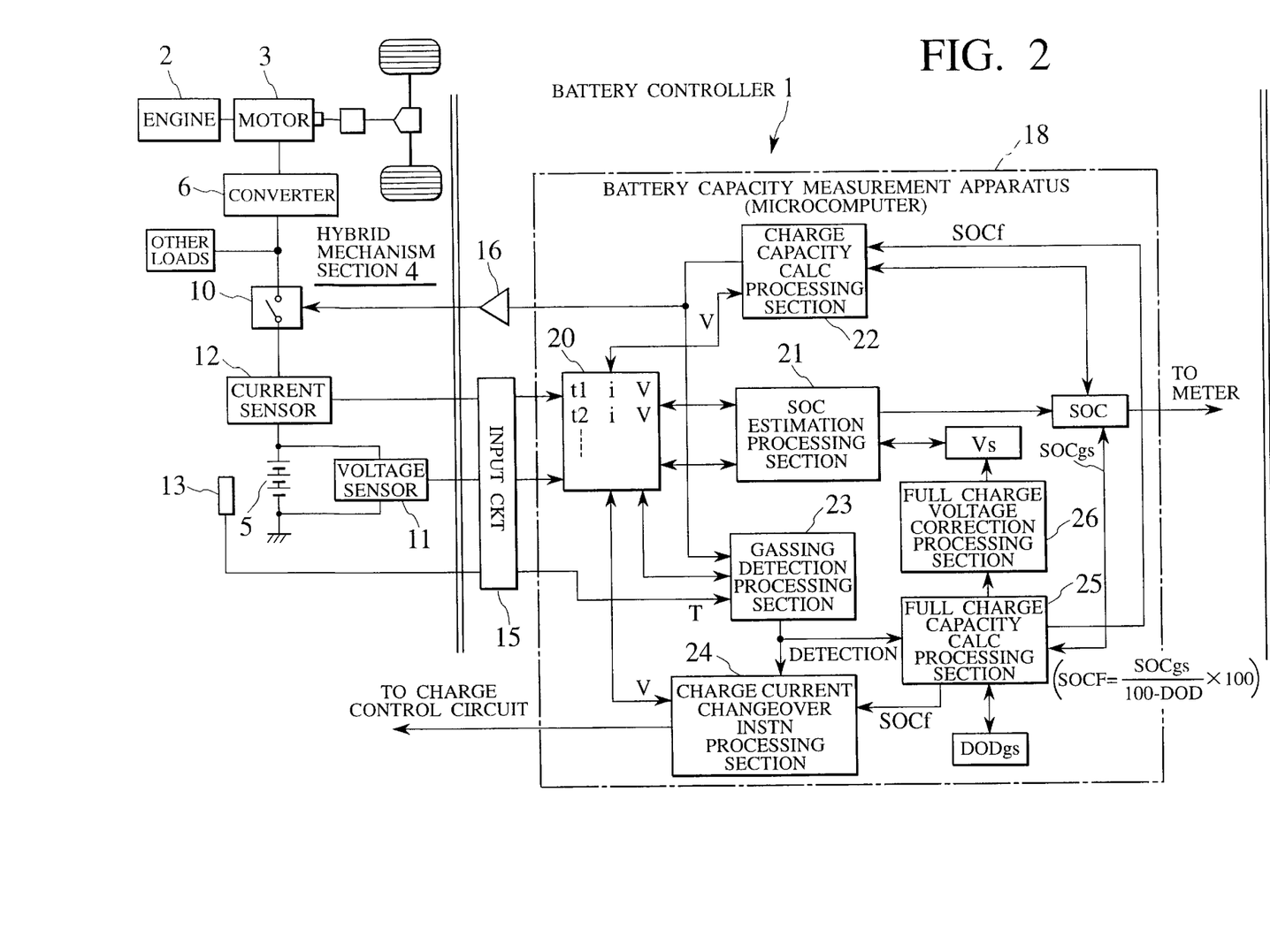
FIG. 2 is a schematic block diagram of a battery capacity measurement apparatus in an embodiment according to the present invention.

FIG. 2 is a schematic block diagram of a battery capacity measurement apparatus in an embodiment according to the present invention. A battery controller 1 shown in FIG. 2 determines the full charge capacity of a battery 5 used in a hybrid mechanism section 4 driven by an engine 2 and a motor 3 (alternator), using a gassing voltage during traveling. The charge power and the discharge power of the battery is controlled by a converter 6.

A voltage sensor 11 is connected in parallel to the battery 5. A relay 10 is also provided between the battery 5 and the converter 6. Between the relay 10 and the battery 5, a current sensor 12 is connected in series. A temperature sensor 13 is also provided in the vicinity of the battery 5.

On the other hand, the battery controller 1 comprises: an input circuit 15 for waveform-shaping the voltage detected by the voltage sensor 11 to a predetermined signal; a buffer 16 for amplifying a relay control signal for turning the relay 10 ON or OFF; and a battery capacity measurement apparatus 18 (microcomputer) which calculates a chargeable capacity of the battery 5 based on the voltage Vi during a predetermined time while the relay 10 was OFF, and stepwisely changes a charge current upon detection of a gassing voltage, and also estimates a full charge capacity at that time, using the gassing voltage and the temperature.

The battery capacity measurement apparatus 18 comprises, as shown in FIG. 2, a memory 20, a remaining capacity estimation processing section 21, a charge capacity calculation processing section 22, a gassing detection processing section 23, a charge current changeover instruction processing section 24, a full charge capacity calculation processing section 25 and a full charge voltage correction processing section 26.

The remaining capacity estimation processing section 21 averages a plurality of voltages and a plurality of currents of the battery 5 collected in the memory 20, respectively, and when the averaged data are collected in a predetermined number, the correlation coefficient r of the data is determined. When the correlation coefficient r shows a strong negative correlation, a regression line (also referred to as "approximation line") of the data is determined from the method of least squares. From the approximation line Y (Y=a·X+b) and a reference current Io, the estimated voltage Vn of the battery at present is estimated.

Then, using the estimated voltage Vn, the full charge voltage Vs set by a full charge voltage correction processing section 26 described later, and a discharge terminating voltage Ve set in advance, the present remaining capacity SOC is determined from the expression (1).

The charge capacity calculation processing section 22 transmits a relay OFF signal to the relay 10 via a buffer 16 to thereby stop charging, and extracts the maximum voltage Vg, of the voltage Vi collected during a predetermined time ti thereafter, under the condition that the maximum voltage Vg is lower than a charge voltage 42V of the converter 6.

Figure 3:
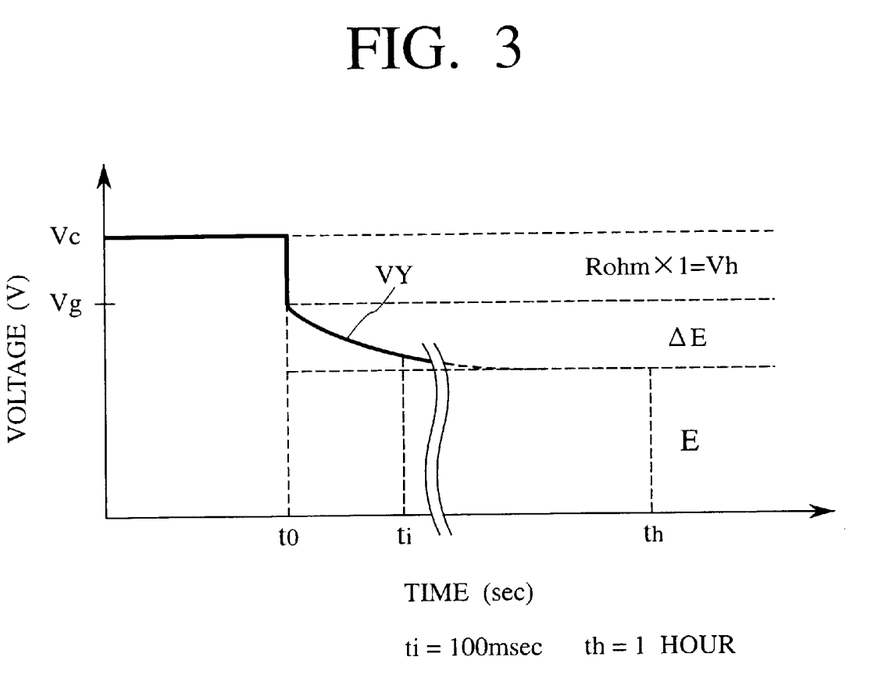
FIG. 3 is a schematic diagram for explaining an operation of a chargeable capacity calculation processing section in the embodiment.

Then, as shown in FIG. 3, a function VY of voltage from the voltage Vg up to the lowest voltage (for example, V100) is determined, to thereby determine a point where the voltage is converged (for example, it is determined by assuming the converging time th to be about 1 hour). That is to say, the actual voltage E of the battery 5 is estimated by removing a difference voltage ΔE of polarization immediately after stopping charging.

Then, using the balanced voltage E, the present chargeable capacity is calculated in the manner shown in the following expression (2).

$$\text{Chargeable capacity} = (Vs^2 - E^2)/(Vs^2 - Ve^2) \qquad (2)$$

Vs: Full charge voltage
Ve: Discharge terminating voltage
E: Balanced voltage

The gassing detection processing section 23 reads the temperature T of the temperature sensor 13 via an input circuit 15, and this temperature T is substituted for the following expression (3), to thereby calculate a gassing voltage Vgs (a voltage wherein at the time of charging, when charging exceeds a certain voltage value, electrolysis of water starts and generation of gas (oxygen, hydrogen) becomes active).

$$Vgs = \alpha - \beta(T - 20^\circ C.) \quad (3)$$

α, β: Intrinsic constant of a battery
T: Electrolyte temperature of the battery

That is to say, by determining the gassing voltage Vgs based on the temperature T at the time of detection, even if the battery characteristics are changed with the change of temperature, the gassing voltage Vgs according to the battery characteristics at that time can be always obtained.

When the charge capacity calculation processing section 22 allows charging (in this embodiment, when the relay is ON), the gassing detection processing section 23 determines if the voltage V at the time of collection reaches the gassing voltage Vgs, and when it is detected that the voltage reaches the gassing voltage Vgs, the gassing detection processing section 23 activates the charge changeover instruction processing section 24 and the full charge capacity calculation processing section 25.

The charge changeover instruction processing section 24 instructs to stepwisely drop the charge current value upon detection of gassing.

For example, when charging is being performed with the charge current of a constant current of 10A, with detection of gassing in the constant current, the charge changeover instruction processing section 24 instructs a charge circuit (not shown) of the converter 6 to stepwisely drop the charge current value, such as 5A, 3A, 2A.

At the time of selection of the current value, the full charge capacity and the capacity at the time of gassing are read, to determine how long it will take to become a full charge, and a current value may be selected so that the full charge is obtained most efficiently and in a fastest way.

The full charge capacity calculation processing section 25 reads the present remaining capacity SOCgs determined by the remaining capacity estimation processing section 21, upon detection of gassing, and estimates the full charge capacity SOCf during traveling from the chargeable capacity DOD set in advance and a full charge capacity (100%) under a predetermined condition. The estimation of the full charge capacity SOCf will be described later in detail.

The full charge voltage correction processing section 26 reads the estimated full charge capacity SOCf, and sets a full charge voltage Vs corresponding to the full charge capacity SOCf in the remaining capacity estimation processing section 21. For example, in the case where the full charge voltage Vs at a reference temperature is 42V, the discharge terminating voltage is 32V, and the estimated full charge capacity SOCf is 70%, the full charge voltage at this time is set to 39.3 V.

Figure 4:
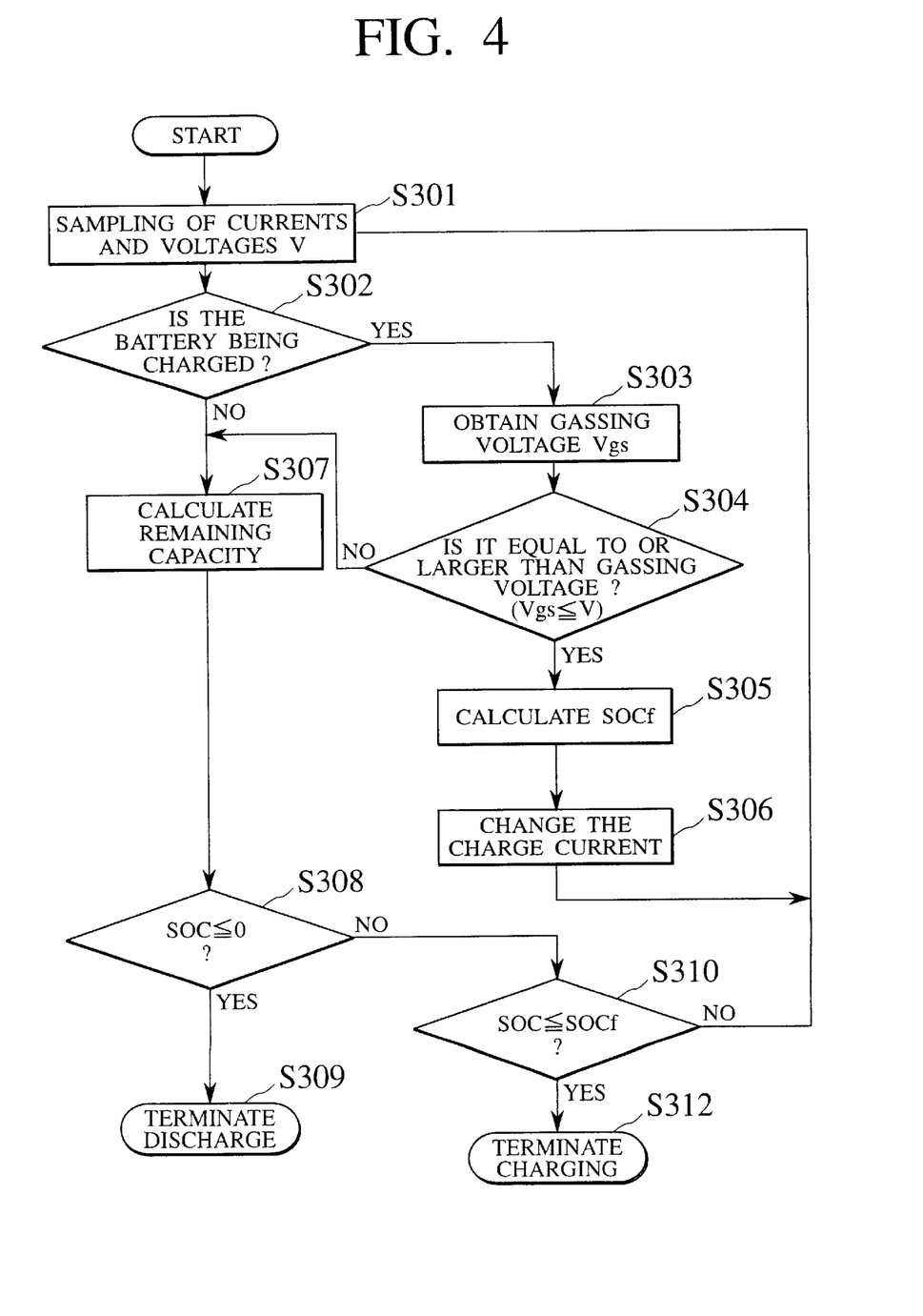
FIG. 4 is a flow chart for illustrating the operation in the embodiment.

The operation of the battery capacity measurement apparatus constructed as described above will now be described with reference to a flow chart in FIG. 4.

At first, the battery capacity measurement apparatus 18 samples the voltage V and the current I detected by the voltage sensor 11 and the current sensor 13 and collects these in the memory 20 (S301).

At this time, it is assumed that the charge capacity calculation processing section 22 is transmitting a relay ON signal to the relay 10 via the buffer 16 to charge the battery 5.

Next, the gassing detection processing section 23 determines if the battery is now being charged or not (S302).

In Step S302, when it is determined the battery is being charged, the gassing detection processing section 23 substitutes the temperature T from the temperature sensor 13 for the above-described expression (3), to obtain the gassing voltage Vgs (S303).

Then, the gassing detection processing section 23 determines if the voltage V at this time is the gassing voltage Vgs determined in Step S303 or not (S304).

For example, when the temperature T is 10° C., the gassing voltage Vgs is determined in the manner shown in the following expression (4), and compared with this gassing voltage Vgs.

$$Vgs(10) = \alpha - \beta(10 - 20^\circ C.) \quad (4)$$

In Step S304, if it is determined that the voltage V at this time equals to or exceeds the gassing voltage Vgs, the full charge capacity calculation processing section 25 determines the full charge capacity SOCf according to the following expression (5).

$$SOCf = [SOCgs/(100 - DODgs)] \times 100 \quad (5)$$

SOCf : Full charge capacity
SOCgs: Remaining capacity
DODgs: Discharge depth at the time of reaching the gassing voltage (also simply referred to as "chargeable capacity")

Figure 5:
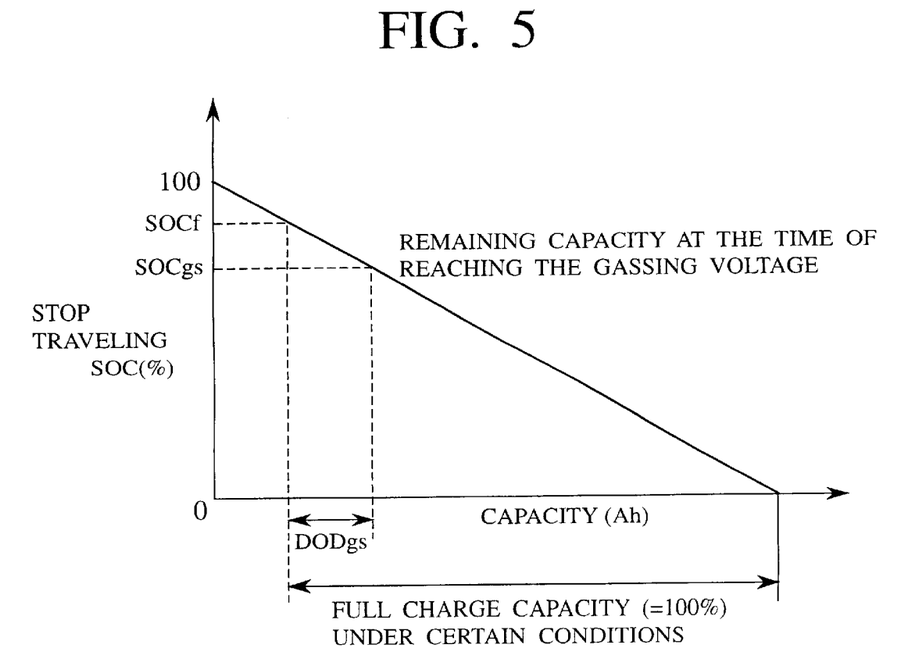
FIG. 5 is a schematic diagram for determining a full charge capacity from a capacity at the time of gassing in the embodiment.

That is to say, as shown in FIG. 5, the full charge capacity calculation processing section 25 estimates the full charge capacity SOCf from a point where the gassing voltage Vgs is obtained, from the present remaining capacity SOCgs when gassing is detected based on the present temperature T of the battery 5, the chargeable capacity DODgs set in advance, and the full charge capacity 100% under a certain condition.

The aforesaid full charge capacity under a certain condition is a capacity when the battery is fully charged at a temperature of, for example, 25° C.

Moreover, the chargeable capacity DODgs set in advance is set such that it becomes substantially constant regardless of the temperature and deterioration, in the hybrid vehicle using a lead battery. For example, it is set to be 20% to 40% so that even if charging is performed by regeneration, overcharge does not occur.

Furthermore, the charge current changeover instruction processing section 24 changes the charge current immediately upon detection of gassing, and returns the processing to Step S301 (S306).

Figure 6A:
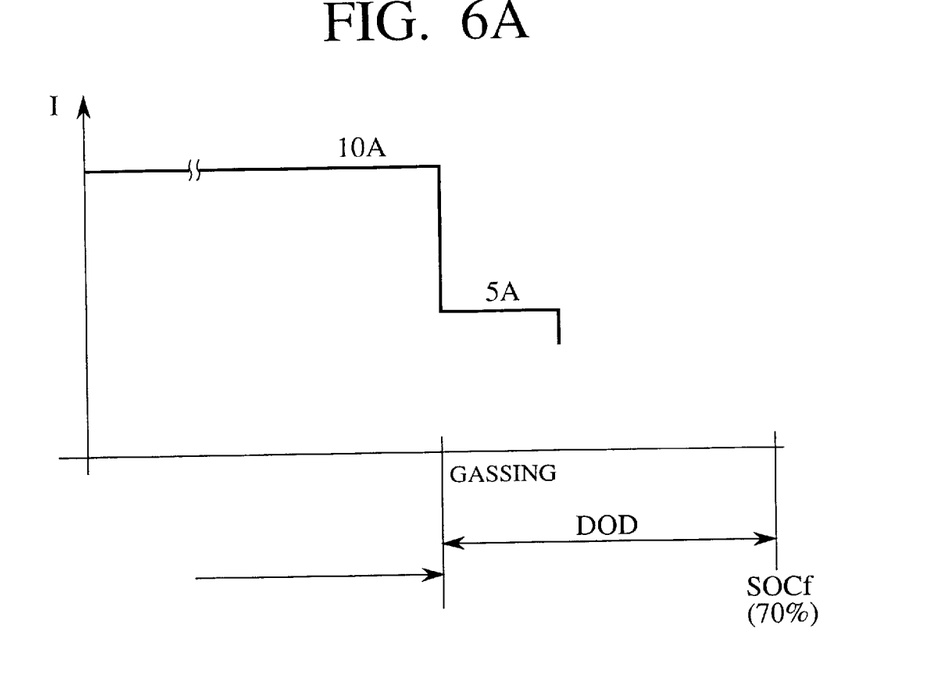
FIGS. 6A and 6B are diagrams for explaining a relation between the charge current multi-stage changeover in the embodiment and a gassing voltage.

That is to say, the charge current changeover instruction processing section 24 changes the charge current from 10A to 5A, with detection of gassing, as shown in FIG. 6A.

Then, in Step S302, when it is determined again that the battery is now being charged, the gassing voltage Vgs is again determined based on the temperature T.

The temperature T of the battery 5 at this time changes due to changeover of the charge current to 5A. Therefore, the gassing voltage Vgs determined in Step S303 is different from the former gassing voltage Vgs. For example, the gassing voltage Vgs becomes higher than the former gassing voltage Vgs.

Therefore, in Step S304, it is determined to be lower than the gassing voltage Vgs, and the processing proceeds to Step S307.

In Step S304, when it is determined that the present voltage V is lower than the gassing voltage Vgs, the remaining capacity estimation processing section 21 averages a plurality of voltages V and a plurality of currents of the battery collected in the memory 20, and when the average data are collected in a predetermined number, the correlation coefficient r of the data is determined. When the correlation coefficient r shows a strong negative correlation, a regression line (also referred to as "approximation line") of the data is determined from a method of least squares. From the approximation line Y (Y=a·X+b) and the reference current Io, the estimated voltage Vn of the battery at present is estimated.

Then, using the estimated voltage Vn, the full charge voltage Vs and the discharge terminating voltage Ve set in advance, the present remaining capacity SOC is determined from the above described expression (1) (S307).

Next, it is determined if the remaining capacity SOC is 0% or not (S308). In Step S308, when it is determined that the remaining capacity SOC is 0%, discharge is terminated (S309). Moreover, in Step S308, when it is determined that the remaining capacity SOC exceeds 0%, it is determined whether or not the present remaining capacity SOC reaches the full charge capacity SOCf determined in Step S305 (S310).

In Step S310, when it is determined that the present remaining capacity SOC reaches the full charge capacity SOCf, charging is terminated (S311). In the present embodiment, the charge capacity calculation processing section 22 transmits a relay OFF signal to the relay 10 to stop charging.

Moreover, in Step S310, when it is determined that the present remaining capacity SOC has not yet reached the full charge capacity SOCf, the processing is returned to Step S301.

Thereby, if charging is being performed with 5A, the temperature T of the battery gradually increases, and a new gassing voltage Vgs is obtained in Step S303, and the gassing voltage Vgs and the voltage V of this time are compared, to determine the present full charge capacity during charging with 5A, hence the charge current is again changed over.

Figure 6B:
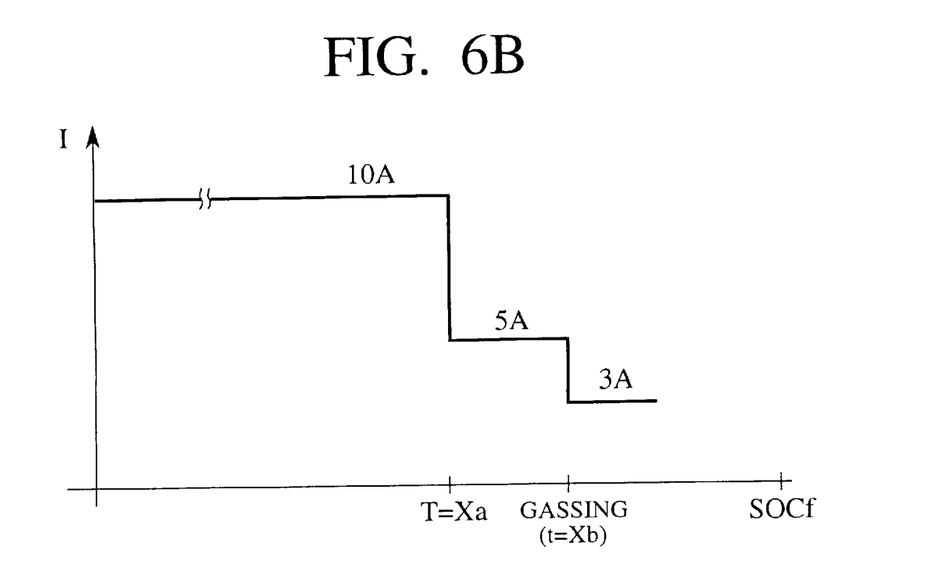

That is to say, as shown in FIG. 6B, the gassing voltage is changed according to the temperature T, and every time the voltage reaches the gassing voltage, the charge current is also changed.

Figure 7:
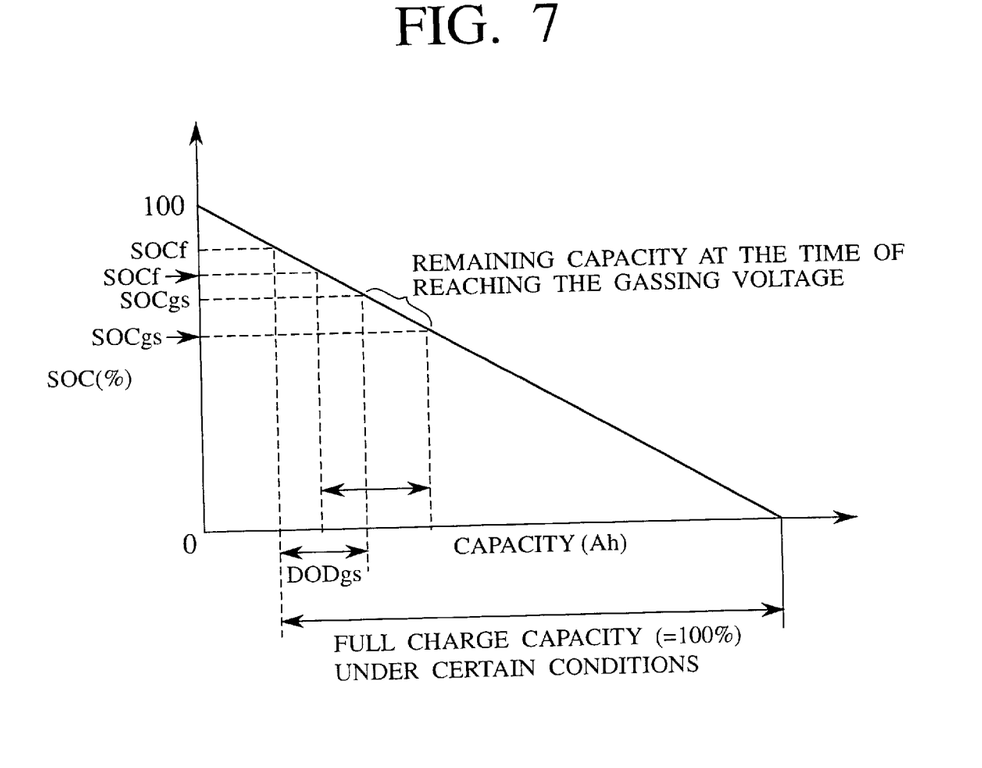
FIG. 7 is a diagram for explaining that the full charge capacity is determined differently due to a gassing voltage in the embodiment.

Therefore, as shown in FIG. 7, since the gassing voltage Vgs determined based on the temperature changes, the full charge capacity SOCf also changes.

That is to say, a gassing voltage is determined at all times based on the temperature of the battery 5 during traveling, and every time the voltage reaches the gassing voltage, the charge current is changed over, as well as the full charge capacity SOCf being estimated from the gassing voltage at that time.

As a result, at the time of traveling, even if the battery characteristics are changed due to the temperature, a full charge capacity can be obtained, taking into consideration the temperature at the time of non-traveling according to the characteristics. Hence, a full charge capacity of the battery at the time of traveling can be accurately obtained.

For example, in the case where the full charge capacity is determined to be 90% according to the processing in this embodiment, and the remaining capacity at the time when gassing occurs is 80%, the battery need only be charged with such a current value that the chargeable capacity during traveling becomes 10%.

According to the present invention, as described above, a gassing voltage is determined at all times based on the temperature of the battery, and the full charge capacity from when the gassing occurred is estimated, even during traveling, from the remaining capacity at the time of gassing and the chargeable capacity. Hence, even if the temperature of the battery changes during traveling, the full charge capacity from when the gassing occurred, determined based on that temperature can be obtained. As a result, such an effect can be obtained that it can be easily determined how much charge current is required to reach the full charge, at the time of charging during traveling.

Therefore, even if the battery is mounted on a hybrid vehicle, or if the battery characteristics change due to the temperature change during traveling, the chargeable capacity can be precisely grasped. As a result, such an effect can be obtained that overcharge or insufficient charge does not occur.

It should be understood that many modifications and adaptations of the invention will become apparent to those skilled in the art and it is intended to encompass such obvious modifications and changes in the scope of the claims appended hereto.

What is claimed is:

1. A battery capacity measurement apparatus which charges a battery with power produced by the operation of a load in a constant current, when the remaining capacity of the battery decreases due to the operation of said load, to thereby keep a set full charge capacity during the load operation, and collects the voltages and currents of said battery to determine the remaining capacity of said battery from these voltages and currents, comprises:
   a temperature sensor for detecting the temperature in the vicinity of said battery;
   a gassing detection processing section which determines a gassing voltage of said battery, based on the temperature detected by said temperature sensor, every time the voltages and currents are collected, and detects that said battery is in a gassing condition, when said collected voltage is or exceeds the gassing voltage;
   a charge current changeover instruction processing section for instructing a changeover of said constant current value at the time of charging said battery to a smaller value, upon detection of the gassing condition; and
   a full charge capacity calculation processing section which reads the remaining capacity every time the gassing condition is detected, and determines the full charge capacity at the time when said load changes, from the remaining capacity at the time of gassing, a chargeable capacity set in advance, and a full charge capacity at the time of a reference temperature and no load, to thereby set the full charge capacity.

2. A battery capacity measurement apparatus according to claim 1, wherein the charge current changeover instruction processing section instructs a stepwise changeover of said constant current value at the time of charging said battery to a smaller value, every time the gassing condition is detected.

3. A battery capacity measurement apparatus according to claim 1, further comprising:
   a full charge voltage correction processing section which corrects the full charge voltage based on the ratio of the set full charge capacity to the full charge capacity at the time of a reference temperature and no load, every time said full charge capacity is set, and measures said remaining capacity based on the corrected full charge voltage.

4. A battery capacity measurement apparatus according to claim 1, wherein said full charge capacity calculation processing section determines the full charge capacity at the time when said load changes on an axis of the full charge capacity.

5. A battery capacity measurement apparatus according to claim 1, wherein said load comprises:

an alternator; and a converter which converts the discharge power from said battery to a predetermined current with respect to the alternator, and converts regenerative electric power from the alternator into charge current of a constant current having a value determined by said charge current changeover instruction processing section.

* * * * *